United States Patent
Brodsky et al.

(10) Patent No.: US 6,423,905 B1
(45) Date of Patent: Jul. 23, 2002

(54) PRINTED WIRING BOARD WITH IMPROVED PLATED THROUGH HOLE FATIGUE LIFE

(75) Inventors: William L. Brodsky, Binghamton; Kevin T. Knadle, Endicott; John M. Lauffer, Waverly; Douglas O. Powell, Endicott; David J. Russell, Apalachin, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/562,109

(22) Filed: May 1, 2000

(51) Int. Cl.[7] .................................................. H05K 1/03
(52) U.S. Cl. ........................ 174/256; 174/262; 361/750; 361/762
(58) Field of Search ................................ 174/262, 254, 174/256, 257, 258; 361/792, 795, 750, 757, 762; 257/701, 702

(56) References Cited

U.S. PATENT DOCUMENTS

| | | | |
|---|---|---|---|
| 4,658,332 A | | 4/1987 | Baker et al. |
| 4,791,248 A | | 12/1988 | Oldenettel |
| 5,194,326 A | * | 3/1993 | Arthur et al. ................ 428/325 |
| 5,258,330 A | * | 11/1993 | Khandros et al. ........... 437/209 |
| 5,367,764 A | * | 11/1994 | DiStefano et al. ............ 29/830 |
| 5,473,119 A | | 12/1995 | Rosenmayer et al. |
| 5,714,252 A | * | 2/1998 | Hogerton et al. ............ 428/344 |
| 5,900,674 A | | 5/1999 | Wojnarowski et al. |
| 6,165,892 A | * | 12/2000 | Chazan et al. ............... 438/623 |
| 6,184,577 B1 | * | 2/2001 | Takemura et al. ........... 257/701 |
| 6,208,525 B1 | * | 3/2001 | Imasu et al. ................. 361/783 |

FOREIGN PATENT DOCUMENTS

JP 11008473 1/1999

OTHER PUBLICATIONS

Hedrick et al., "High Density Printed Wiring Board Possessing Controlled Coefficients of Thermal Expansion With Thin Film Redistribution Layer," IBM Application Ser. No. 08/833,614 (Filed Apr. 8, 1997).

* cited by examiner

Primary Examiner—Albert W. Paladini
(74) Attorney, Agent, or Firm—Ratner & Prestia; Lawrence R. Fraley, Esq.

(57) ABSTRACT

A printed wiring board having a layered composite of metal planes and dielectric layers. At least one of the dielectric layers has a modulus lower than the modulus of the remaining dielectric material layers. A plating, extending through the layered composite, has a first land on a first external surface of the layered composite, a second land on a second external surface of the layered composite, and a barrel extending between the first land and the second land. The lower modulus dielectric material layer deforms during thermal excursions of the printed wiring board in such a way as to reduce the strains imposed on both the lands and the barrel of the plated through holes.

6 Claims, 2 Drawing Sheets

PRINTED WIRING BOARD WITH IMPROVED PLATED THROUGH HOLE FATIGUE LIFE

TECHNICAL FIELD

The present invention relates, in general, to the construction of printed wiring boards and, in particular, to protecting against failures in the plated through holes in printed wiring boards that are caused by changes in temperature.

BACKGROUND OF THE INVENTION

Plated through holes are often formed in printed wiring boards. Such plated through holes are subject to failure over time due to fatigue caused by the cyclic strains that are the result of changing temperatures during fabrication, operation, or storage. These strains arise because of a mismatch in the coefficients of thermal expansion (CTE) between two materials: the metal forming the barrel of the plated through hole, which is usually copper having a CTE of approximately 17 ppm/° C., and the out-of-plane CTE of the dielectric material used in the printed wiring board, which is typically greater than 40 ppm/° C.

Multi-layer printed wiring boards typically are constructed by laminating several layers of dielectric material, with metal interconnection circuitry on one or usually both sides, using uncircuitized layers of a similar dielectric material to bond the ciruitized layers together. In microvia build-up arrangements, additional layers can be added sequentially by laminations, curtain, roller or screen coating or other methods known to those skilled in the art. The various layers of circuitry then are electrically interconnected by first drilling holes that intersect the circuit features that are to be connected and then plating the walls of the holes with metal (creating plated through holes) to form the connections. The hollow cylindrical hole wall metal that is formed is known to those skilled in the art as a "barrel." This plating also connects the hole wall metallization (i.e. the barrel) with metal on the front and back exterior surfaces of the laminated structure. The exterior surface metal is usually patterned to provide lands surrounding the plated through holes which are larger than the diameters of the holes.

FIG. 1 is a schematic cross-section view of a typical, conventional printed wiring board substrate 10. Printed wiring board substrate 10 has a glass reinforced epoxy laminate 12 and inner copper planes 14 and 16. Inner copper plane 14 is connected to a plating 18 of a through hole 20, while inner copper plane 16 has a clearance opening and is not connected to plating 18 of through hole 20.

Plating 18 is composed of a first land 18a, a second land 18b, and a barrel 18c. As the printed wiring board of FIG. 1 is exposed to temperature changes, possibly as great as −25° C. to +115° C., strains arise in plating 18 that can result in failures. With thinner printed wiring boards, the failure is likely to occur where first land 18a or second land 18b meet barrel 18c and, with thicker printed wiring boards, the failure is more likely to occur at or near the middle of barrel 18c.

The dielectric materials used to construct multi-layer printed wiring boards are usually thermosetting organic polymers, most often epoxies. These polymers have coefficients of thermal expansion in the range of about 50 ppm/° C. to 80 ppm/° C. below the glass transition temperature ($T_g$) and as high as 200 ppm/° C. to 400 ppm/° C. above $T_g$. To minimize or eliminate entirely the thermally induced strains in the copper due to this CTE mismatch, the organic dielectrics are reinforced with low expansion fibers. The most common reinforcement is woven fiber glass cloth, but non-woven fiber glass fibers, woven aramid fibers, and non-woven aramid fibers also are used. The ratio of organic polymer to reinforcement fiber is normally chosen to give a composite CTE, in the plane of the dielectric layer, of about 20 ppm/° C. or lower. This choice reduces the strains in, and the potential fatigue cracking of, the copper circuit lines.

The reinforcement also improves the mechanical robustness of the dielectric layers, as well as the finished printed wiring boards. Because of the anisotropic nature of the fiber reinforcement, the out-of-plane CTE gets little, if any, reduction due to the reinforcement. As a result, the copper barrels of the plated through holes are subjected to cyclic strains when the printed wiring boards are subjected to thermal excursions, especially excursions above $T_g$ such as those during soldering operations for component assembly. These cyclic strains can lead to fatigue cracking of the barrels of the plated through holes resulting in open circuits and product failure. The thermal cycle cracking problem becomes worse with thicker printed wiring boards, smaller diameter plated through holes and thinner plating in the barrels of the plated through holes. The need for increased interconnection density in printed wiring boards drives all of these factors in the direction that decreases thermal cycle fatigue life.

The plated through hole fatigue problem is generally recognized within the industry. Most of the known attempts to solve the problem, however, drive one or more of the causative factors (e.g. structure thickness, plated through hole diameter, plated through hole barrel metal thickness) in a direction opposite to that desired for higher-density printed wiring boards.

U.S. Pat. No. 4,791,248 issued to Oldenettel describes a method of placing a plated through hole in a printed circuit board having a conductive core. In this patent, an insulating collar has a CTE closer to the conductive core than the CTE of epoxy. The object is to match CTE values. Thermal shock tolerance is achieved by filling oversized through holes with glass-filled resin and plating the inner surfaces of holes drilled in the filling resin.

U.S. Pat. No. 5,900,674 issued to Wojnarowski et al. teaches an interface structure for electronic devices. A floating pad is constructed above the metallized surface of a printed circuit board. More specifically, the patent describes an interface structure for electronic devices having a surface with an electrically conductive pad, a compliant coating over the surface with a via extending to the conductive pad, a metallization pattern over the compliant coating and extending into the via, and a low-modulus dielectric interface layer overlaying the compliant coating.

U.S. Pat. No. 4,658,332 issued to Baker et al. teaches a printed circuit board having a compliant layer to reduce the thermal mismatch between the printed circuit board and a lead-less chip carrier. The compliant layer is sandwiched between a pattern of conductors and an insulating layer, providing "floating" component mounting pads to reduce the carrier stresses. The elasticity of the compliant layer provides mechanical decoupling for minimizing stresses on solder joints.

U.S. Pat. No. 5,473,119 issued to Rosenmayer et al. teaches a stress-resistant circuit board. The circuit board resists shear stress caused by the unequal CTE of a mounted electronic component and the circuit board on which the component is mounted. The circuit board is described as a support layer, a shear stress-relieving layer, and a conductive layer. The disclosed arrangement is similar to that of the '332 patent. Rosenmayer et al. expand the modulus of elasticity of the compliant material, however, from 20,000 to 50,000 psi.

Japanese Published Patent Application No. 09161409, filed on behalf of Seiji, is directed to a printed wiring board. Seiji seeks to solve the problem of cracking when the board is subjected to repeated heating and cooling tests. Seiji appears to eliminate cracking in the board by forming circuits on both sides of the board and providing a plated through hole making contact to both the upper and lower layers. The holes are inclined through the board and are filled to increase life. The resin filling the plated through hole has a CTE different from that of the board. There is no compliant or resilient layer described in the printed circuit board.

The high-density printed wiring board disclosed by Hedrick et al. in IBM Application Ser. No. 08/833,614 (Filed Apr. 8, 1997) has a controlled CTE and a thin film redistribution layer. The printed circuit board is laminated with a core of Aramid or liquid crystalline polymer. The authors do not suggest increasing compliancy to extend plated through hole life.

SUMMARY OF THE INVENTION

An object of the present invention is to provide a new and improved printed wiring board. It is another object of the present invention to provide a new and improved printed wiring board in which the likelihood of failures in the plated through holes, caused by changes in temperature, is greatly reduced or eliminated entirely.

A printed wiring board, constructed in accordance with the present invention, includes a layered composite having a plurality of dielectric material layers, at least one of the dielectric material layers having a modulus lower than the modulus of the remaining dielectric material layers. The layered composite of dielectric material layers has a through hole extending through the layered composite from an upper surface of the layered composite to a lower surface of the layered composite. A printed wiring board, constructed in accordance with the present invention, also includes a plating extending through the hole in the layered composite from the upper surface of the layered composite to the lower surface of the layered composite. The plating has a first land on the upper surface of the layered composite, a second land on the lower surface of the layered composite, and a barrel in the through hole extending between the first land and the second land.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
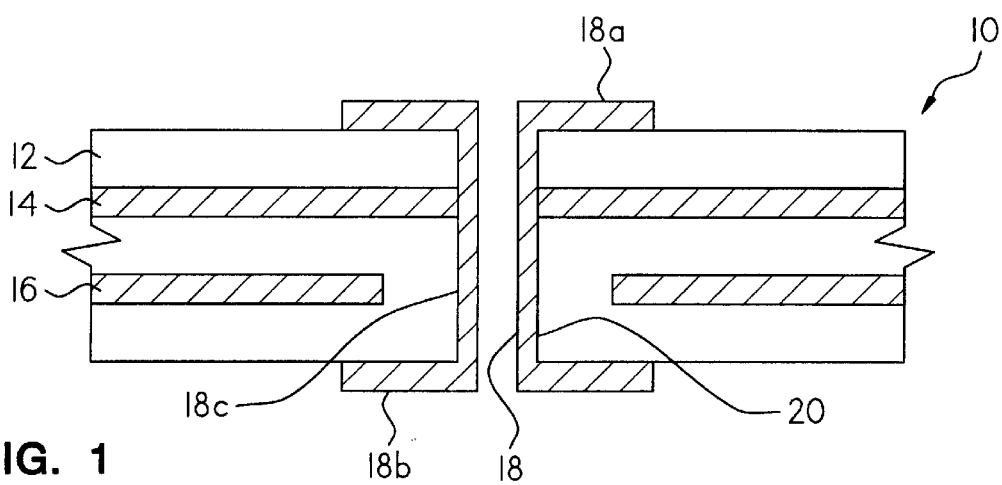
FIG. 1 is a schematic cross-section view of a typical, conventional printed wiring board.
Figure 2:
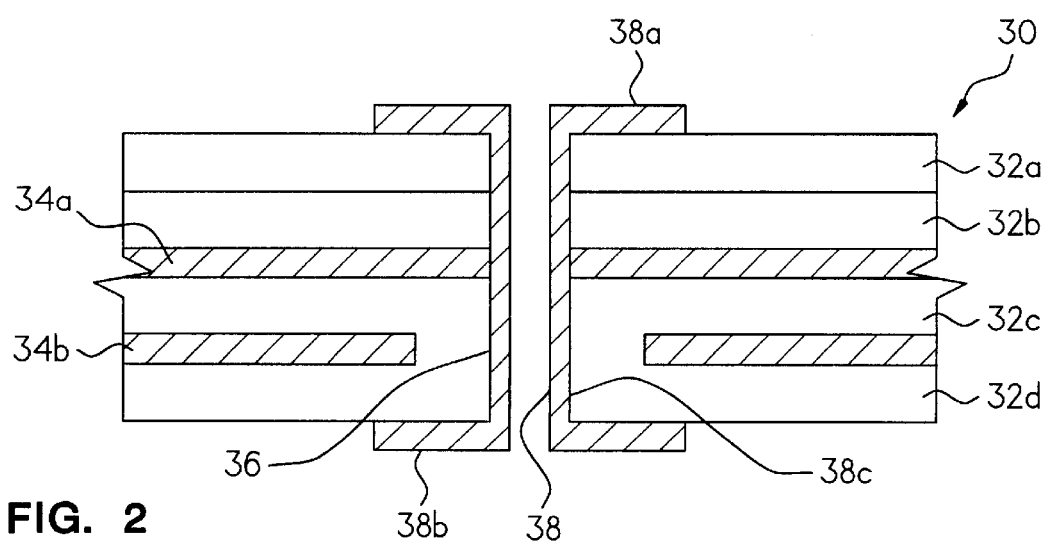
FIG. 2 is a schematic cross-section view of a first embodiment of a printed wiring board constructed in accordance with the present invention.

Referring now to the drawing, in which like reference numbers refer to like elements throughout, FIG. 2 is a schematic cross-section view of a first embodiment of a printed wiring board constructed in accordance with the present invention. In this embodiment of the invention, the printed wiring board includes a layered composite of dielectric material layers and at least one conductive layer disposed between a pair of the dielectric material layers. For the embodiment of the invention illustrated by FIG. 2, the printed wiring board 30 includes four dielectric material layers 32$a$, 32$b$, 32$c$, and 32$d$, a first conductive layer 34$a$ disposed between dielectric material layers 32$d$ and 32$c$ and a second conductive layer 34$b$ disposed between dielectric material layers 32$c$ and 32$d$. Conductive layers 34$a$ and 34$b$ are typically copper but can be a conductive polymer or a conductive material filled polymer. It will be understood that conductive layers 34$a$ and 34$b$ may be discontinuous, such as in the form of electrical circuit lines or other features.

The initial strain in a material is essentially proportional to the stress. Moreover, the strain is reversible. After the stress is removed, the strain disappears. This lineal, reversible strain is "elastic" strain. The modulus of elasticity (or Young's modulus), E, is the ratio between the stress and this reversible strain according to the equation, E=Stress÷Strain. The metric units of modulus are pascals or megapascals, Mpa; the corresponding English units are pounds per square inch, psi. The modulus of a material is important because it relates directly to the rigidity of the product constructed using the material.

Figure 3:
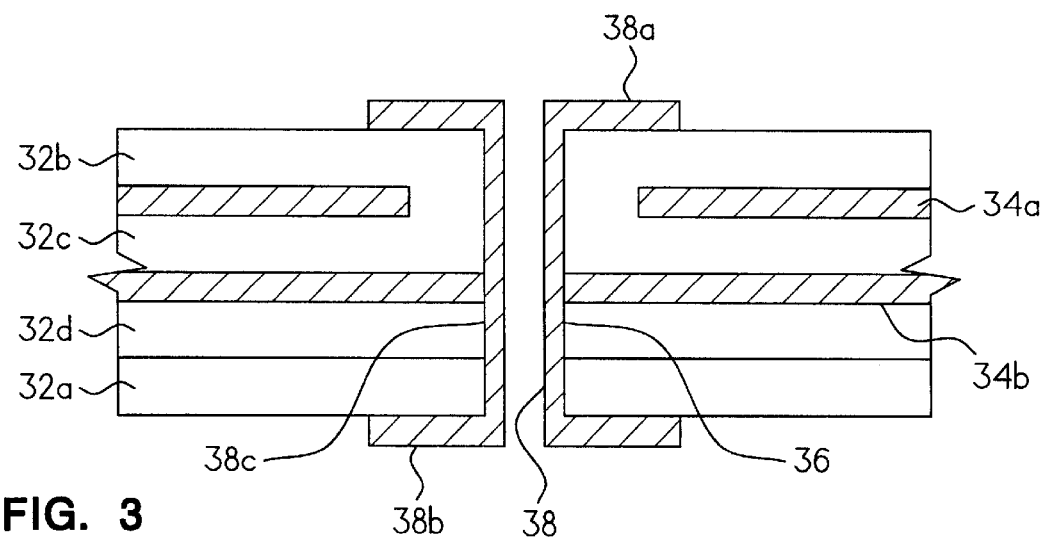
FIG. 3 is a schematic cross-section view of a second embodiment of a printed wiring board constructed in accordance with the present invention.

At least a first of the dielectric material layers of the layered composite has a modulus lower than the modulus of the remaining dielectric material layers of the layered composite. For the embodiment of the invention illustrated by FIG. 2, the dielectric material layer having a lower modulus is the outer, upper layer 32$a$. This lower modulus dielectric material layer can form the upper surface of the layered composite, as illustrated by FIG. 2 or, in accordance with a second embodiment of the present invention, the lower surface of the layered composite, as illustrated in FIG. 3.

A through hole 36 extends through the layered composite of dielectric material layers 32$a$, 32$b$, 32$c$, and 32$d$ and conductive layers 34$a$ and 34$b$ from an upper surface of the layered composite to a lower surface of the layered composite. A printed wiring board, constructed in accordance with the present invention, further includes a plating 38 disposed in through hole 36 in the layered composite of dielectric material layers and conductive layers. Plating 38 extends from the upper surface of the layered composite to the lower surface of the layered composite and has a first land 38$a$ on the upper surface of the layered composite, a second land 38$b$ on the lower surface of the layered composite, and a barrel 38$c$ in through hole 36 and extending between the first land 38$a$ and the second land 38$b$ and connected to conductive layer 34$a$.

Figure 4:
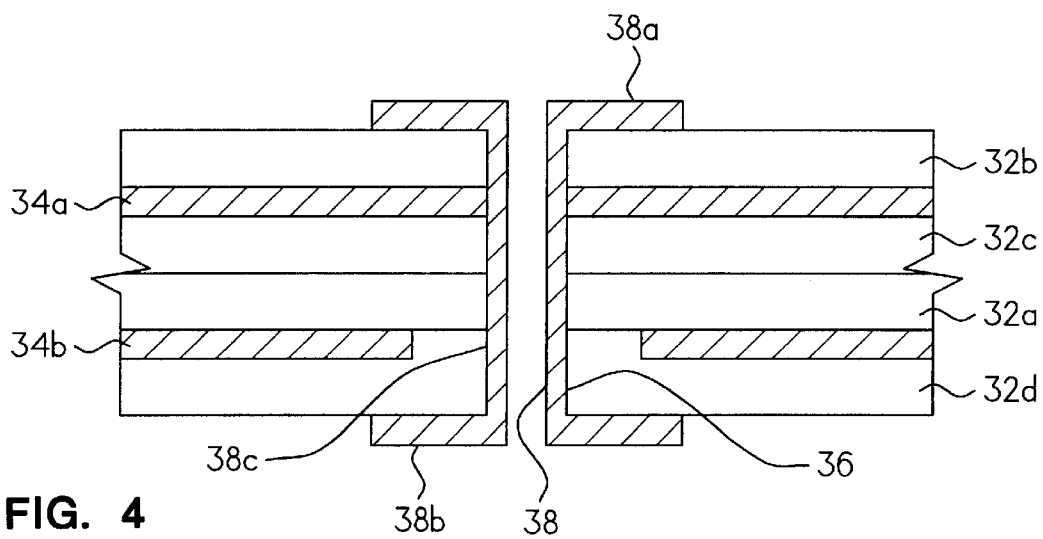
FIG. 4 is a schematic cross-section view of a third embodiment of a printed wiring board constructed in accordance with the present invention.

In accordance with a third embodiment of a printed wiring board constructed in accordance with the present invention, the dielectric material layer 32$a$ having a lower modulus is an inner layer as illustrated by FIG. 4. In all other respects, this third embodiment of the present invention is similar to the first and second embodiments.

Figure 5:
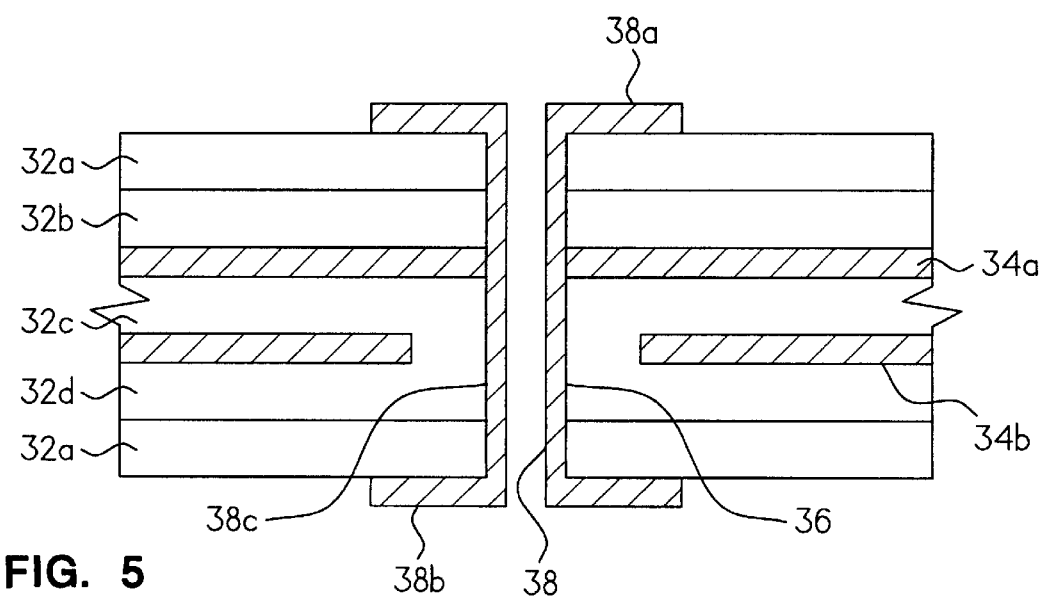
FIG. 5 is a schematic cross-section view of a fourth embodiment of a printed wiring board constructed in accordance with the present invention.

In accordance with a fourth embodiment of a printed wiring board constructed in accordance with the present invention, the layered composite of dielectric material layers and metal planes can include two low modulus dielectric layers 32$a$, 32$a$ as illustrated by FIG. 5. Both of the two low modulus dielectric layers can be outer layers, as illustrated by FIG. 5; or both can be inner layers; or one can be an outer layer and one can be an inner layer. In all other respects, this fourth embodiment of the present invention is similar to the first and second embodiments.

The present invention improves the thermal cycle fatigue life of plated through holes in printed wiring boards by providing one or two outer dielectric material layers or one or more inner dielectric material layers that have a significantly lower modulus than the other dielectric material layers that are reinforced and make up the bulk of the structure of the printed wiring board. The lower modulus dielectric material layers are essentially unreinforced by either high modulus fibers, or high volume loading of particulate fillers. The lower modulus dielectric material layers deform during thermal excursions in such a way as to reduce the strains imposed on both the lands and the barrels of the plated through holes that connect the plated through holes to the interconnection circuitry on the external surfaces.

The following table indicates typical results achieved by incorporating the present invention in printed wiring boards.

| Laminate Thickness | Laminate Modulus | Build-Up Layer Thickness | Build Up layer Modulus | PTH Mean cycles to fail (23 C–220 C) |
|---|---|---|---|---|
| 25 mil | 2216 cloth/no cloth 16 GPa/11 GPa @ 22 C 14 GPa/9 GPa @ 150 C | 10 mil (5 mil per side) | 3.1 GPa @ 22 C 0.1 GPa @ 150 C | 100 cycles |
| 35 mil | 16 GPa/11 GPa @ 22 C 14 GPa/9 GPa @ 150 C | None | N/A N/A | 45 cycles |

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A printed wiring board comprising:
   a layered composite having an upper surface, a lower surface, and:
   (a) a plurality of dielectric material layers, at least a first of said dielectric material layers being an inner dielectric layer having a modulus lower than the modulus of the remaining dielectric material layers, and
   (b) a through hole extending through said layered composite from said upper surface of said layered composite to said lower surface of said layered composite; and
   a plating extending through said through hole in said layered composite from said upper surface of said layered composite to said lower surface of said layered composite and having:
   (a) a first land on said upper surface of said layered composite,
   (b) a second land on said lower surface of said layered composite, and
   (c) a barrel in said through hole extending between said first land and said second land.

2. The printed wiring board according to claim 1 wherein said layered composite has a second dielectric material layer having a modulus lower than the modulus of said remaining dielectric material layers.

3. The printed wiring board according to claim 2 wherein both said dielectric material layers having a lower modulus than the modulus of said remaining dielectric material layers are inner layers.

4. The printed wiring board according to claim 2 wherein one of said dielectric material layers having a lower modulus than the modulus of said remaining dielectric material layers is an inner layer and one of said dielectric material layers having a lower modulus than the modulus of said remaining dielectric material an outer layer.

5. The printed wiring board according to claim 1 wherein said dielectric material layer having a lower modulus is free of high modulus fibers and high volume loading of particulate fillers.

6. The printed wiring board according to claim 1 further including at least one conductive layer disposed between a pair of said dielectric material layers and connected to said barrel.

* * * * *